US008921980B2

(12) United States Patent
Amano et al.

(10) Patent No.: US 8,921,980 B2
(45) Date of Patent: Dec. 30, 2014

(54) ALUMINUM NITRIDE SINGLE CRYSTAL FORMING POLYGONAL COLUMNS AND A PROCESS FOR PRODUCING A PLATE-SHAPED ALUMINUM NITRIDE SINGLE CRYSTAL USING THE SAME

(75) Inventors: Hiroshi Amano, Nagoya (JP); Yukihiro Kanechika, Shunan (JP); Masanobu Azuma, Shunan (JP)

(73) Assignees: Meijo University, Nagoya-shi (JP); Tokuyama Corporation, Shunan-shi (JP)

(*) Notice: Subject to any disclaimer, the term of this patent is extended or adjusted under 35 U.S.C. 154(b) by 1163 days.

(21) Appl. No.: 12/743,703

(22) PCT Filed: Nov. 18, 2008

(86) PCT No.: PCT/JP2008/070945
§ 371 (c)(1),
(2), (4) Date: May 19, 2010

(87) PCT Pub. No.: WO2009/066663
PCT Pub. Date: May 28, 2009

(65) Prior Publication Data
US 2010/0255304 A1 Oct. 7, 2010

(30) Foreign Application Priority Data

Nov. 22, 2007 (JP) .................. 2007-303311
Nov. 22, 2007 (JP) .................. 2007-303312

(51) Int. Cl.
*C30B 29/40* (2006.01)
*C30B 23/00* (2006.01)

(52) U.S. Cl.
CPC .............. *C30B 29/403* (2013.01); *C30B 23/00* (2013.01)

USPC ................ 257/615; 117/87; 117/88; 117/952

(58) Field of Classification Search
CPC .................... H01L 21/0254; H01L 21/02458; H01L 21/02389; C30B 29/403
USPC ................. 257/615; 117/87, 88, 952
See application file for complete search history.

(56) References Cited

U.S. PATENT DOCUMENTS 3,634,149 A * 1/1972 Knippenberg et al. ......... 117/87
5,688,320 A 11/1997 Gribkov et al.
(Continued)

FOREIGN PATENT DOCUMENTS

JP 2064100 A 3/1990
JP 4097998 A 3/1992
(Continued)

OTHER PUBLICATIONS

Patent Abstracts of Japan, English Computer Translation of JP 2005-132699 (2013).*

(Continued)

*Primary Examiner* — Matthew Song
(74) *Attorney, Agent, or Firm* — The Webb Law Firm (57) ABSTRACT

An aluminum nitride single crystal in the form of polygonal columns, the polygonal columns having the following properties [a] to [c]: [a] the content of a metal impurity is below a detection limit, [b] the average bottom area is from $5 \times 10^3$ to $2 \times 10^5$ $\mu m^2$, and [c] the average height is 50 μm to 5 mm. The above aluminum nitride single crystal is preferably obtainable in a method including the steps of sublimating an aluminum nitride starting material (A) containing 0.1 to 30% by mass of a rare earth oxide by heating the starting material at a temperature of not lower than 2000° C., depositing aluminum nitride on a hexagonal single crystal substrate and thereby growing aluminum nitride single crystal in the shape of polygonal columns.

6 Claims, 7 Drawing Sheets

(56) References Cited

U.S. PATENT DOCUMENTS 6,001,748 A * 12/1999 Tanaka et al. .................. 438/791
2006/0006395 A1 * 1/2006 Kobayashi et al. ............. 257/77

FOREIGN PATENT DOCUMENTS

| JP | 9118598 A | 5/1997 |
| JP | 2004284869 A | 10/2004 |
| JP | 2005132699 A | 5/2005 |
| JP | 2006021964 A | 1/2006 |

OTHER PUBLICATIONS

M. Yonemura et al., "Precipitation of single crystalline AlN from Cu-Al-Ti solution under nitrogen atmosphere", Journal of Materials Science, Apr. 2005, vol. 16, No. 4, pp. 197-201, Springer Science + Business Media, Inc.

Trottier, Remi, et al.; "Size measurement of particles" In: "Kirk-Othmer Encyclopedia of Chemical Technology, 4th ed. vol. 22"; Jan. 1, 1997; John Wiley & Sons; USA; XP055116518; pp. 256-278.

* cited by examiner

ALUMINUM NITRIDE SINGLE CRYSTAL FORMING POLYGONAL COLUMNS AND A PROCESS FOR PRODUCING A PLATE-SHAPED ALUMINUM NITRIDE SINGLE CRYSTAL USING THE SAME

FIELD OF THE INVENTION

The present invention relates to an aluminum nitride single crystal forming polygonal columns (polygonal columns of aluminum nitride single crystal) and a process for producing the same and also relates to a process for producing a plate-shaped aluminum nitride single crystal using the aluminum nitride single crystal forming polygonal columns. More specifically, the present invention relates to an aluminum nitride single crystal forming polygonal columns and a process for producing the aluminum nitride single crystal forming polygonal columns by growing an aluminum nitride single crystal on a hexagonal single crystal substrate, and also relates to a process for producing a plate-shaped aluminum nitride single crystal which process comprises sublimating an aluminum nitride starting material typified by an aluminum nitride sintered body, depositing aluminum nitride on a hexagonal inorganic single crystal substrate and thereby forming and growing an aluminum nitride single crystal.

TECHNICAL BACKGROUND

In recent years, aluminum nitride single crystals have been noticed particularly from the viewpoint of applying them to substrates for semiconductor devices or the like. As the process for producing the aluminum nitride single crystals, it is known that a process comprises sublimating an aluminum nitride starting material, depositing an aluminum nitride single crystal on a seed crystal such as silicon carbide, aluminum nitride or the like and thereby growing the aluminum nitride single crystal.

For example, Patent document 1 discloses an experiment such that a sintered mass obtainable by sintering 99.99% powdery aluminum nitride is used as a starting material for sublimation and a susceptor having a bevel surface and a seed crystal are used and thereby a single crystal having a large diameter can be prepared with a small amount of defects. It further discloses that the half width of a rocking curve is small and a single crystal having a thickness of about 20 mm can be prepared. Patent document 2 discloses an experiment such that powdery aluminum nitride is used as a starting material for sublimation, a single crystal is grown while contacting the single crystal with the inner wall of a crystal growing vessel and thereby polycrystallization is depressed. It also discloses that an aluminum nitride single crystal having a low surface roughness, and having a diameter of 48 mm and a thickness of 1.5 mm can be obtained.

Meanwhile, for a process for producing a whiskery aluminum nitride single crystal, Patent document 3 discloses a process for producing whiskers of an aluminum nitride single crystal which process comprising using a composition obtainable by blending powdery alumina with a specific metal oxide as a starting material, heating the blend in a nitrogen atmosphere in the presence of carbon and thereby forming the whiskers in the composition.
Patent Document 1: JP-A-2004-284869
Patent Document 2: JP-A-2006-21964
Patent Document 3: JP-A-2005-132699

As described above, conventionally known processes for producing aluminum nitride single crystals have problems that the growing rate is slow and it needs a very long period of time for producing a large single crystal although they can prepare high quality aluminum nitride single crystals.

Under the circumstances, it is an object of the present invention to provide a process for producing an aluminum nitride single crystal having high quality in a high growing rate efficiently.

In the conventional process for producing a whiskery aluminum nitride single crystal, as described above, since the whisker formation is caused in the powdery starting material, there are problems such that it is difficult to achieve complete processing of all of the starting material powder, and the resulting whiskers contain the powdery starting material which is difficult to be removed. Furthermore, a metal oxide used as the starting material may also be present in the formed whiskers.

Under the circumstances, it is another object of the present invention to provide an aluminum nitride single crystal forming polygonal columns containing a slight amount of fine powder or impurities, and to provide a process for producing the aluminum nitride single crystal forming polygonal columns.

SUMMARY OF THE INVENTION

The present inventors have earnestly studied and found that an aluminum nitride single crystal forming polygonal columns having a very high purity can be formed using a specific aluminum nitride starting material, sublimating the starting material and thereby depositing and growing aluminum nitride on a hexagonal single crystal substrate, and further found that since the aluminum nitride single crystal forming polygonal columns is not formed in power, the above metal impurities, fine powder or the like are hardly adhered on the crystal. Thus, the present invention has been accomplished. Moreover, they found that the aluminum nitride single crystal forming polygonal columns formed on the single crystal substrate can grow an aluminum nitride single crystal at a high rate by contacting with a sublimating gas of aluminum nitride and it is useful as a precursor in the preparation of a large sized single crystal. Thus, the present invention has been accomplished. In other words, they found that the above subjects of preparing a plate-shaped aluminum nitride single crystal having high quality at a high growing rate efficiently can be solved by the combined use of specific aluminum nitride starting materials as the aluminum nitride starting material used for sublimation and thereby the present invention has been accomplished.

That is to say, according to the present invention, an aluminum nitride single crystal forming polygonal columns, the polygonal columns having the following properties [a] to [c], can be prepared by, for example, the above method;
[a] the content of a metal impurity is below the detection limit,
[b] the average bottom area is from $5 \times 10^3$ to $2 \times 10^5$ $\mu m^2$, and
[c] the average height is 50 µm to 5 mm.

The description that the content of a metal impurity is below the detection limit means the fact that metal elements are not detected by ICP emission analysis. Specifically, an aluminum nitride single crystal forming polygonal columns is pulverized and heat decomposed by adding nitric acid and phosphoric acid to prepare a solution, and then the solution is submitted to ICP emission analysis using [ICPS-7510] manufactured by Shimadzu Corporation. The metal concentration is determined based on the calibration curve previously prepared. In this analysis, it means that a metal impurity is not detected. For example, the content of yttrium is not more than 5 ppm.

The aluminum nitride single crystal forming polygonal columns according to the present invention is obtainable by sublimating an aluminum nitride starting material (A) containing 0.1 to 30% by mass of a rare earth oxide by heating the starting material at a temperature of not lower than 2000° C., depositing aluminum nitride on a hexagonal single crystal substrate and thereby growing aluminum nitride single crystal in the shape of polygonal columns.

The aluminum nitride single crystal forming polygonal columns used herein is obtainable by cutting the polygonal columns of aluminum nitride single crystal grown on the hexagonal single crystal substrate.

The hexagonal inorganic single crystal substrate is preferably an $\alpha$-$Al_2O_3$ single crystal substrate, a SiC single crystal substrate or an AlN single crystal substrate.

The process for producing an aluminum nitride single crystal forming columns according to the present invention comprises a step of sublimating an aluminum nitride starting material (A) containing 0.1 to 30% by mass of a rare earth oxide by heating the starting material at a temperature of not lower than 2000° C., depositing aluminum nitride on a hexagonal single crystal substrate and thereby growing aluminum nitride single crystal in the shape of polygonal columns.

The process for producing a plate-shaped aluminum nitride single crystal according to the present invention comprises:

[1] a step of growing an aluminum nitride single crystal into a plurality of polygonal columns by sublimating an aluminum nitride starting material (A) containing 0.1 to 30% by mass of a rare earth oxide by heating the starting material at a temperature of not lower than 2000° C., and depositing aluminum nitride on a hexagonal inorganic single crystal substrate, and

[2] a step of forming a plate-shaped aluminum nitride single crystal by sublimating an aluminum nitride starting material (B) containing not more than 50 ppm of a rare earth oxide, depositing aluminum nitride on the surfaces of the polygonal columns of the aluminum nitride single crystal and thereby further growing the aluminum nitride single crystal into a plate-shaped aluminum nitride single crystal.

The hexagonal inorganic single crystal substrate is preferably an $\alpha$-$Al_2O_3$ single crystal substrate, a SiC single crystal substrate or an AlN single crystal substrate.

The step [1] is preferably a step of growing an aluminum nitride single crystal into a plurality of polygonal columns in such a way that the proportion (formation density) of the total of the bottom areas of the deposited polygonal columns to the surface area of the hexagonal inorganic single crystal substrate on which the aluminum nitride single crystal is to be grown is 20 to 90%.

The aluminum nitride single crystal forming columns of the present invention is a new one having a high purity and free of fine powder and can be used effectively for fillers and other uses. Furthermore, a structural material coated with the aluminum nitride single crystal obtainable by the process for the aluminum nitride single crystal forming columns according to the present invention is useful as a precursor in the preparation of a large size single crystal by sublimating aluminum nitride and further growing the crystal.

According to the process for producing the plate-shaped aluminum nitride single crystal of the present invention, a single crystal having high quality and a sufficiently large size can be prepared. Moreover, according to the process for producing the aluminum nitride single crystal of the present invention, the above single crystal can be prepared at a high growing rate.

BRIEF DESCRIPTION OF THE DRAWINGS

FIG. 4-1 is an SEM photograph taken in an oblique top view of the aluminum nitride single crystal forming polygonal columns prepared in the step [1] in the example;
FIG. 4-2 is an SEM photograph taken in an oblique top view of the aluminum nitride single crystal forming polygonal columns prepared in the step [1]

DESCRIPTION OF THE MARK

Detailed Description of the Invention

The present invention will be described in detail below.

Figure 42:
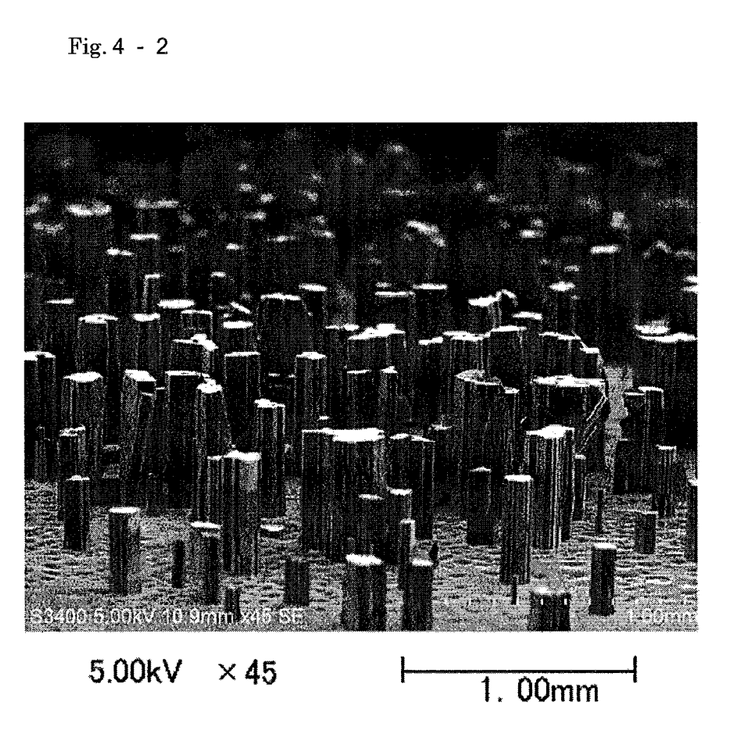

The aluminum nitride single crystal forming polygonal columns according to the present invention satisfies the following properties and has a polygonal columnar shape (referred to FIG. 4-2 and FIG. 5). [a] The content of a metal impurity is below the detection limit. [b] The average bottom area is from $5 \times 10^3$ to $2 \times 10^5$ $\mu m^2$. [c] The average height is 50 $\mu m$ to 5 mm.

The process for producing the plate-shaped aluminum nitride single crystal by producing the aluminum nitride single crystal forming polygonal columns and growing the aluminum nitride single crystals on the hexagonal inorganic single crystal substrate comprises the steps [1] and [2] as described later.

The present invention will be described in detail with reference to the drawings of the apparatus used in the invention below. The following apparatus is one example of the apparatus for producing the plate-shaped aluminum nitride single crystal of the present invention, and the structure and the like thereof are not limited as long as the plate-shaped aluminum nitride single crystal according to the present invention can be produced.

<Step [1]>

In the step [1], the aluminum nitride starting material (A) containing 0.1 to 30% by mass of a rare earth oxide is sublimated and aluminum nitride is deposited on the hexagonal inorganic single crystal substrate, thereby aluminum nitride single crystal is grown into a plurality of polygonal columns.

Although the hexagonal inorganic single crystal substrate used in the present invention is not particularly limited, examples thereof are an $\alpha$-alumina ($Al_2O_3$) single crystal substrate, a silicon nitride (SiC) single crystal substrate and an aluminum nitride (AlN) single crystal substrate. Among them, the $\alpha$-alumina single crystal substrate used for general epitaxial growth, specifically a sapphire substrate is preferable. As the crystal face of the substrate, {1 1 –2 0} face and {0 0 0 1} face are preferable. Furthermore, although the size of the hexagonal inorganic single crystal substrate is not particularly limited, it is usually 10 to 50 mm, preferably 10 to 30 mm in order to produce the plate-shaped aluminum nitride single crystal having a uniform thickness.

Moreover, the surface of the hexagonal inorganic single crystal substrate is preferably mirror polished to have a surface roughness (Ra) of not more than 0.02 $\mu m$. The mirror polishing of the surface has merits such that the adhesion strength between the substrate and the columnar-shaped crystal is enhanced, and the growing directions of the columnar-shaped crystals are vertical and uniform.

It is important that the aluminum nitride starting material (A) used in the present invention contains the rare earth oxide in an amount of 0.1 to 30% by mass, preferably 0.1 to 10% by mass. That is to say, in the present invention, using the sintered body (A) containing the rare earth oxide in the specific amount, the aluminum nitride single crystal forming polygonal columns is prepared by heating at a relatively low temperature. Examples of the rare earth oxides are $Y_2O_3$, $CeO_2 HO_2O_3$, $Yb_2O_3$, $Gd_2O_3$, $Nd_2O_3$, $Sm_2O_3$, and $Dy_2O_3$. Among them, $Y_2O_3$, $CeO_2$ and $Yb_2O_3$ are preferred. Namely, when the aluminum nitride starting material (A) contains the above rare earth oxide in the above amount, the aluminum nitride single crystal forming polygonal columns having high quality and a sufficient size can be grown at a high rate. Furthermore, when the aluminum nitride starting material (A) contains the above rare earth oxide in the above amount, the number of the aluminum nitride single crystal forming polygonal columns produced can be increased and also the bottom area of each of the aluminum nitride single crystal forming polygonal columns can be increased. Moreover, the formation density of the aluminum nitride single crystal forming polygonal columns produced (the proportion of the polygonal pillar-shaped aluminum nitride single crystals to the surface area of the substrate) can be controlled to the proper range as described later. The aluminum nitride starting material (A) may contain the rare earth oxide singly or two or more thereof. When it contains two or more rare earth oxides, the total amount of them may be in the above range.

The amount of the rare earth oxide can be measured by a fluorescent X-ray analysis method. Specifically, the amount of the rare earth metal is determined by the fluorescent X-ray analysis method and then the amount is converted to the amount of the rare earth oxide.

The aluminum nitride starting material (A) used in the present invention is not particularly limited as long as it has the above composition, and it may be in a sintered state, a mixture of the powdery aluminum nitride and the powdery rare earth oxide, or a molded article thereof. In order to carry out the sublimation as described later stably and thereby to form the aluminum nitride single crystal forming polygonal columns firmly, the sintered state is most preferred.

The sintered body (hereinafter, sometimes referred to "sintered body (A)") contains the rare earth oxide in an amount of 0.1 to 30% by mass, preferably 0.1 to 10% by mass as described above. In the case of the sintered body (A), the amount of the rare earth oxide is determined by the fluorescent X-ray analysis method. Specifically, the amount of the rare earth metal in the sintered body (A) is determined by the fluorescent X-ray analysis method and then the amount is converted into the amount of the rare earth oxide used in the preparation of the sintered body (A). The example of the rare earth oxide used in the preparation of the sintered body (A) and the preferred amount range are the same as the above.

Specifically, the sintered body can be produced in the following manner. Concerning the powdery aluminum nitride, which is a starting material, the oxygen concentration is not particularly limited, and a usually available powder can be used. The concentration of oxygen contained in the starting material powdery aluminum nitride is usually from 0.5 to 3.0% by weight. The concentration of metal impurities (concentration of metals other than Al) is preferably not more than 50 ppm. The powdery aluminum nitride is considered that oxygen atoms are present in an $Al_2O_3$ state on the surfaces of the aluminum nitride particles.

Examples of the rare earth oxide, which is a starting material, are $Y_2O_3$, $CeO_2$, $Ho_2O_3$, $Yb_2O_3$, $Gd_2O_3$, $Nd_2O_3$, $Sm_2O_3$ and $Dy_2O_3$.

Furthermore, the specific surface area (BET specific surface area) of the rare earth oxide is preferably 1 to 50 $m^2/g$ from the viewpoint of sintering properties.

The amount of the rare earth oxide used is appropriately regulated so that the amount of the rare earth oxide in the resulting sintered body (A) is in the above range.

The powdery aluminum nitride and the powdery rare earth oxide can be mixed by a conventionally known method. For example, a method of mixing by a dry form or a wet form using a mixer such as ball mill or the like can be employed favorably. In the wet mixing method, a dispersion medium such as alcohols, hydrocarbons, etc. is used. It is preferred to use alcohols or hydrocarbons from the viewpoint of dispersibility.

In this mixing, it is preferred that the powdery rare earth oxide, which is kept in a dry air in order to prevent the rare earth oxide from moisture adsorption or aggregation, is optionally dried in vacuo and is immediately mixed with the powdery aluminum nitride.

Prior to the sintering, the mixed powder thus prepared is molded into a shape capable of giving a desired component. This molding can be carried out by a known means. Furthermore, in order to prepare a molded article having high strength and enhance the yield, the molding is preferably carried out using an organic binder.

For example, the mixed powder is mixed with the organic binder and optionally a dispersant, a plasticizer or a solvent to prepare a slurry or paste for molding, and then the slurry or paste for molding is molded into a molded article by a molding means such as an extrusion molding method, an injection molding method or a casting molding method. Moreover, it is possible to prepare granules from the slurry for molding and mold into a molded article by a compression molding method.

Examples of the organic binder may include a butylal resin such as polyvinyl butylal etc. and an acrylic resin such as polymethacrylbutyl etc. The organic binder is used in an amount of usually 0.1 to 30 parts by weight, preferably 1 to 15 parts by weight per 100 parts by weight of the powdery aluminum nitride.

Examples of the dispersant are a glycerin and the like, and examples of the plasticizer are a phthalic acid ester and the like. An isopropyl alcohol and a hydrocarbon are used as the solvent.

The molding can be still carried out by the compression molding method without using the organic binder. For example, the mixed powder of the powdery aluminum nitride and the powdery rare earth oxide is preliminarily molded by a mono-axial forming device to prepare a green body and the green body is pressure-molded at a pressure of 1 to 4 $t/cm^2$ using a CIP (cold isostatic press) molding machine to prepare the above molded article.

The molded article thus prepared is de-waxed (de-bindered) and then sintered. The de-waxing can be carried out by heating in any atmosphere of air, nitrogen and hydrogen. The de-waxing temperature, which varies depending on the kind of the organic binder, is usually 300 to 900° C., preferably 300 to 700° C. In the molding without using the organic binder, like the compression molding method, the de-waxing step is unnecessary.

In order to determine the amount of the rare earth oxide in the above range, the sintering is carried out in an atmosphere of an inert gas such as $N_2$ gas etc.

The sintering in the inert gas atmosphere is preferably carried out at a temperature of 1650 to 1950° C. for 1 to 10 hr.

The sintered body (A) is prepared through the above sintering step.

Figure 1:
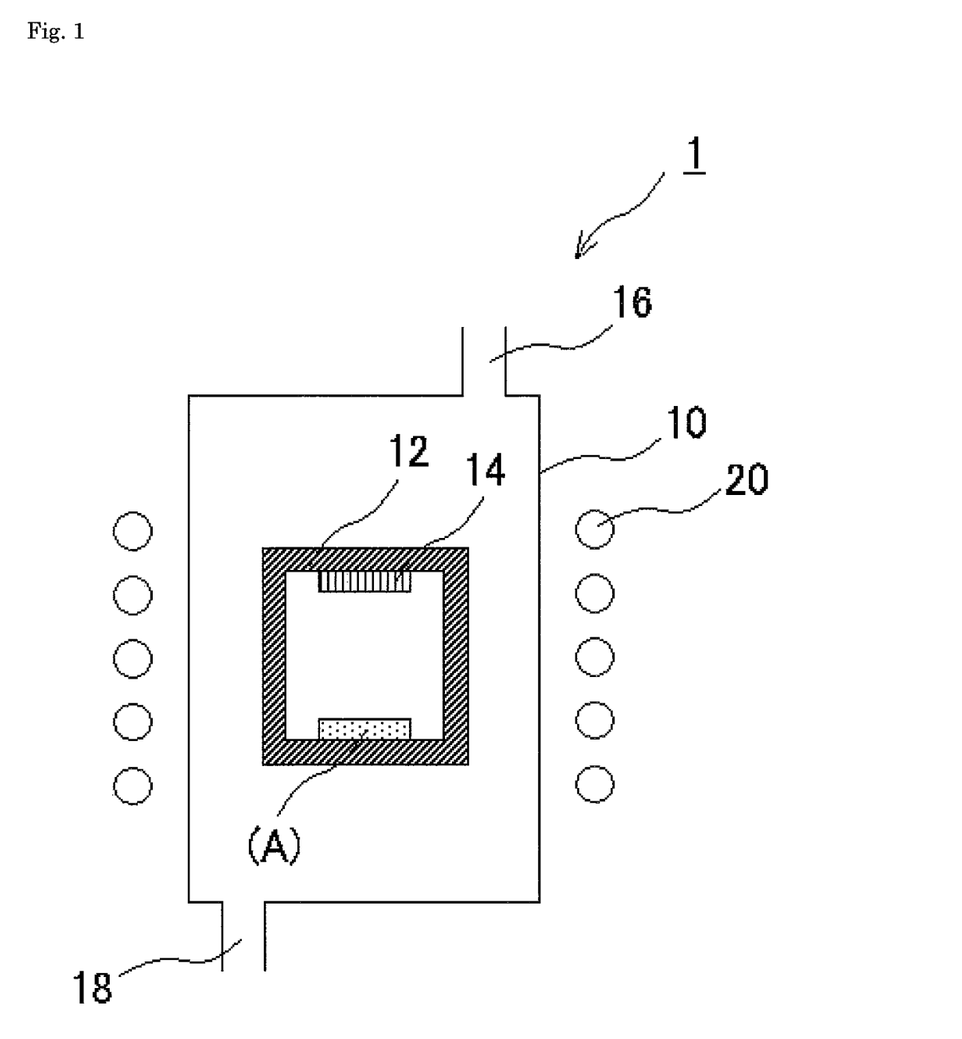
FIG. 1 is a view illustrating the present invention.
Figures 1, 4:
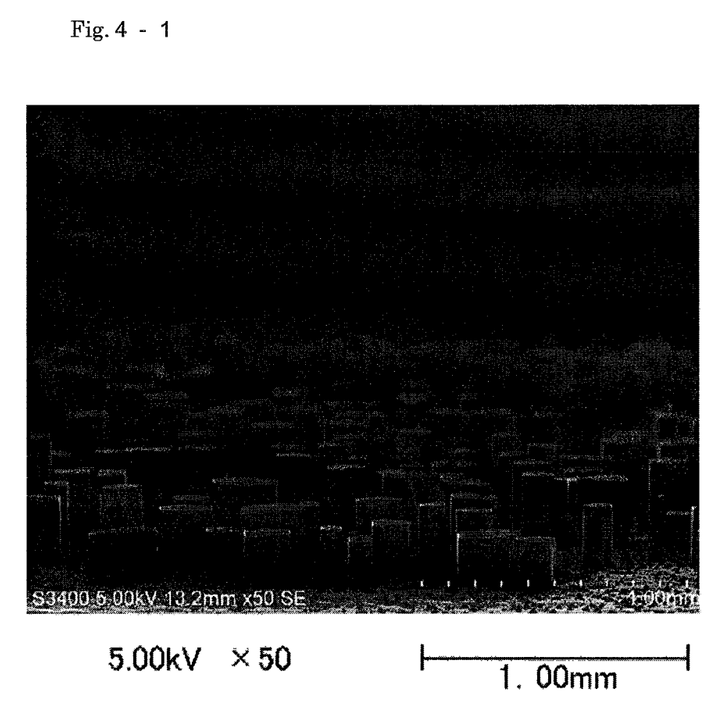

In the step [1], a furnace 1, for example, as shown in FIG. 1 is used together with the above hexagonal inorganic single crystal substrate and the aluminum nitride starting material (A) represented by the above sintered body (A). On the center of a furnace main body 10 of the furnace 1, a carbon crucible 12 is provided as a source of generating carbon. At first, on the crucible 12, a hexagonal inorganic single crystal substrate 14 and the aluminum nitride starting material (A) are disposed. The distance between the surface of the hexagonal inorganic single crystal substrate 14 and the surface of the aluminum nitride starting material (A) is usually 1 to 35 mm, preferably 30 to 35 mm. When the distance is nearer than the above range, the substrate temperature is higher than the desired temperature and thereby the substrate is occasionally damaged. When the distance is farther than the above range, the single crystal is not occasionally grown. The optimum distance is preferably determined by carrying out experience previously because the optimum range of the above distance varies by the size of the crucible and the like.

Subsequently, the pressure of the furnace main body 10 is set to be 1 to 1000 kPa, preferably 90 to 1000 kPa. Specifically, exhaust is carried out from a gas exhaust vent 16 and also a $N_2$ gas is introduced from a gas feed opening 18 so that the pressure is the above pressure at 25° C. A $N_2$ gas having a purity of not less than 99.9999% is preferable.

After the furnace main body 10 is in the above atmosphere, a high-frequency heating coil 20 provided on the outside of the furnace main body 10 is operated, the crucible 12, namely, the aluminum nitride starting material (A) and the hexagonal inorganic single crystal substrate 14 are heated and thereby the temperature $T_1$ of the aluminum nitride starting material (A) is brought to 1900 to 2300° C., preferably 2000 to 2300° C., and also the temperature $T_2$ of the hexagonal inorganic single crystal substrate 14 is brought to 1800 to 2100° C. When the temperature $T_1$ is lower than the above range, the polygonal columnar-shaped crystal is not produced occasionally. Furthermore, the temperature $T_1$ is 50 to 200° C., preferably 100 to 200° C. higher than the temperature $T_2$. When the temperature difference is smaller than the above range, the polygonal columnar-shaped crystal is not produced occasionally. In the present invention, the temperatures of the hexagonal inorganic single crystal substrate 14 and the aluminum nitride starting material (A) can be measured by a radiation thermometer. In the above, the case that the heating is started after the crucible main body has been the above atmosphere is described. Moreover, the heating may be carried out previously or the heating and the atmosphere formation may be carried out simultaneously.

In order that $T_1$ and $T_2$ are brought to the above ranges, two heaters, which are independent in the controlling system, may be used. In this case, the output of the heater for heating the aluminum nitride starting material (A) and the output of the heater for heating the inorganic single crystal substrate 14 are respectively regulated to be the above temperatures.

In the step [1], the aluminum nitride starting material (A) is coexisted with the carbon crucible 12 used as a carbon-generating source. The carbon crucible 12 used as a carbon-generating source generates a carbon gas by heating and thereby the inside of the crucible 12 becomes a reducing atmosphere. As the source of generating carbon, it is possible to use a carbon furnace main body, amorphous carbon or carbons such as graphite etc. in addition to the carbon crucible.

Figure 2:
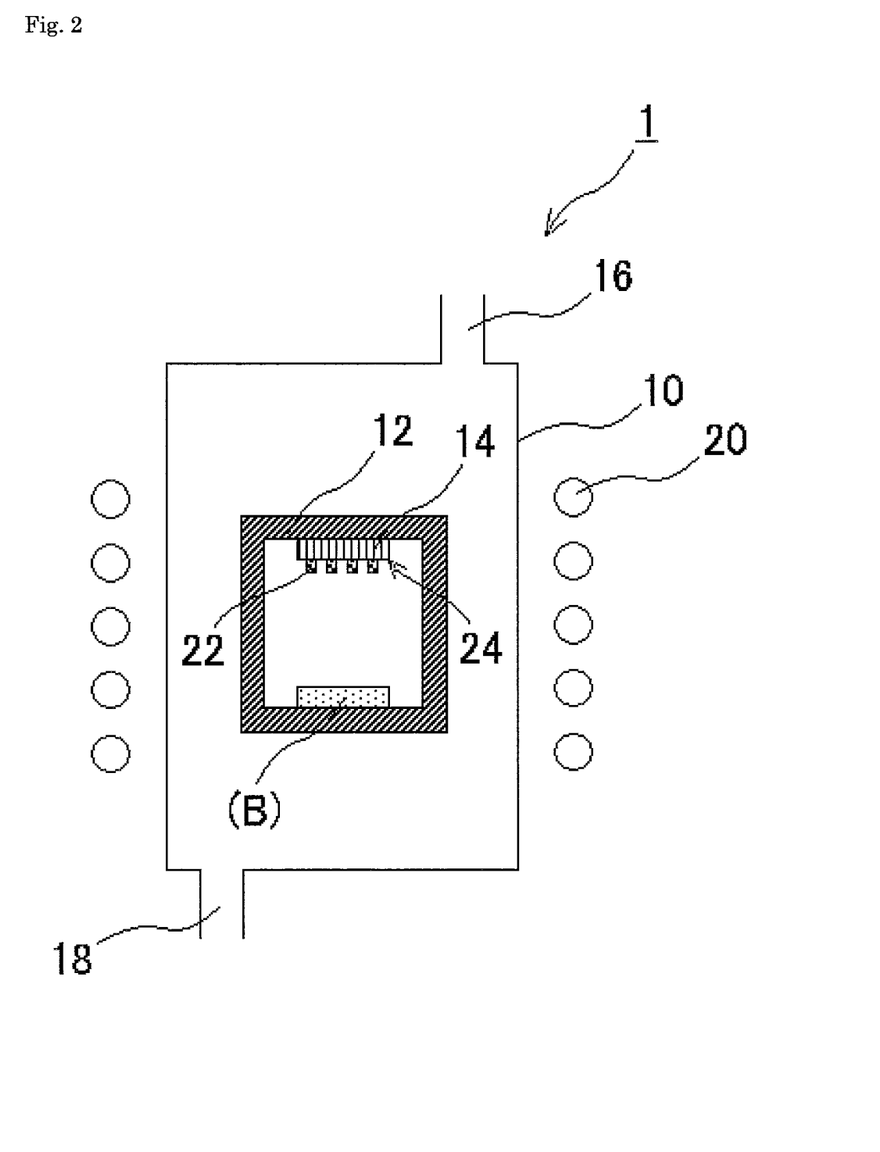
FIG. 2 is a view illustrating the present invention.

Through the above step, the aluminum nitride starting material (A) is sublimated and thereby aluminum nitride is deposited on the hexagonal inorganic single crystal substrate 14 to grow the aluminum nitride single crystal forming polygonal columns 22 (referred to FIG. 2). Accordingly, the aluminum nitride single crystal coated structure prepared in the step [1] has the aluminum nitride single crystal forming polygonal columns grown on the hexagonal single crystal substrate. In order to grow the aluminum nitride single crystal forming polygonal columns having a sufficient size, it is preferred that the temperatures $T_1$ and $T_2$ reach the above ranges and thereafter they are maintained for usually 1 to 3 hr.

Figure 5:
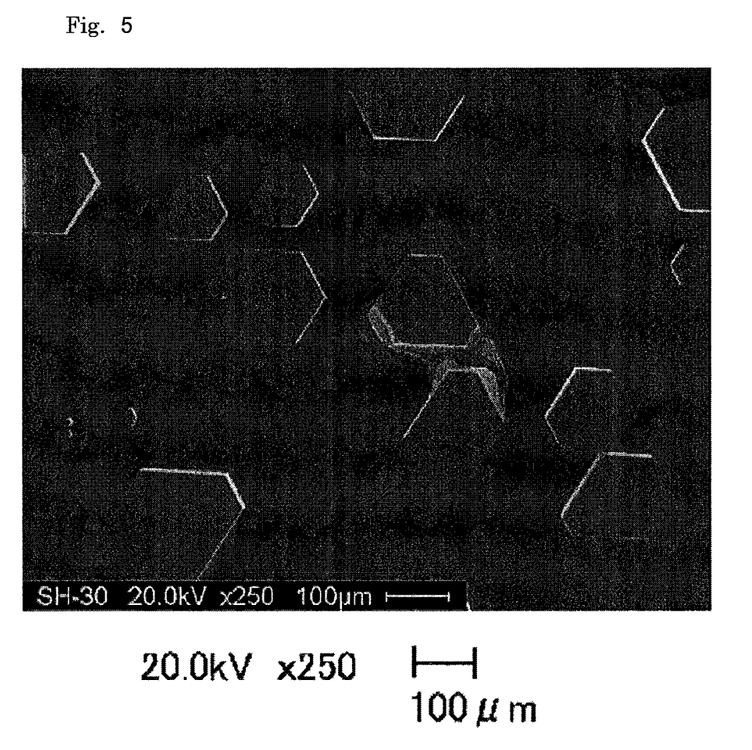
FIG. 5 is an SEM photograph taken in a top view of the aluminum nitride single crystal forming polygonal columns prepared in the step [1]

The aluminum nitride single crystal forming polygonal columns thus prepared usually satisfies the following properties [a] to [c] and has a polygonal columnar-shape (referred to FIG. 4-2 and FIG. 5).

[a] The content of a metal impurity is below the detection limit.
[b] The average bottom area is from $5\times10^3$ to $2\times10^5$ $\mu m^2$.
[c] The average height is 50 μm to 5 mm.

The description that the content of a metal impurity is not more than the detection limit means that any of metal elements other than aluminum is not detected by ICP emission analysis. The metal elements other than aluminum are metal impurities contained in the starting material, for example, Ca, Fe, Si, Ti, Ni, Cr, Na and rare earth metal elements such as Y etc. Specifically, the aluminum nitride single crystal forming columns is pulverized and then nitric acid and phosphoric acid are added to the pulverized crystal and thermally decomposed to prepare a solution and the solution is submitted to ICP emission analysis using "ICPS-7510" manufactured by Shimadzu Corporation. The metal concentration is determined based on the calibration curve previously prepared. In this analysis, the above description indicates that any of metal elements other than aluminum is not detected. For example, the amount of yttrium is not more than 5 ppm. Concerning the metal elements other than aluminum, the amount of Ti is not more than 0.6 ppm, the amount of Ca, Fe or Cr is not more than 1 ppm, the amount of Ni is not more than 2 ppm, the amount of Na is not more than 5 ppm and the amount of Si is not more than 9 ppm.

In the aluminum nitride single crystal forming polygonal columns, the full width at half maximum of an X-ray diffraction rocking curve of the (002) face is 100 to 300 arc sec. The description "the full width at half maximum of a rocking curve" is defined as follows. A diffraction chart is obtained by changing an X-ray incidence angle ω while the angle between an X-ray generating device and a detector is fixed in order that a specimen satisfies the Bragg diffraction conditions. The range of the incidence angle ω which gives 50% or more of the maximum value of diffraction intensity in the diffraction chart is defined as "the full width at half maximum of a rocking curve". As this value is smaller, the single crystal has higher quality.

The formation of the aluminum nitride single crystal can be confirmed by X-ray diffraction measurement.

The aluminum nitride single crystal forming columns according to the present invention is obtainable by cutting the polygonal columns of aluminum nitride single crystal grown on the hexagonal single crystal substrate.

Growing the aluminum nitride single crystal in the above conditions (particularly, using the aluminum nitride sintered body containing a specific rare earth compound as a material for sublimation), aluminum nitride single crystal forming a plurality of polygonal columns having above physical properties can be grown.

The single crystals are desirably grown so that the formation density is preferably 20 to 90%, more preferably 40 to 85%. The formation density means the proportion of the total of the bottom areas of the aluminum nitride single crystal forming polygonal columns deposited to the area of the surface of the hexagonal inorganic single crystal substrate on which the aluminum nitride single crystals are to be grown. The step [1] is preferably completed (specifically, the heating by a high frequency heating coil 20 is preferably stopped) after the formation density of the single crystal having the above physical properties becomes 40 to 90%, more preferably 60 to 90%, furthermore preferably 60 to 85% of the above ranges. When the above step is completed after the formation density becomes the above range and the following step [2] is carried out, since the aluminum nitride single crystal forming polygonal columns is also grown in the lateral direction and they are liked each other to form a plate shape easily, while they are grown in the vertical direction, the plate-shaped single crystal having a sufficient size can be prepared efficiently. Moreover, the resulting single crystal has sufficiently high quality.

In the step [1], the mechanism of forming the aluminum nitride single crystal forming polygonal columns by heating at a relatively low temperature is considered as follows. The sintered body (A) contains AlN particles, a complex oxide containing Al and rare earth metals present in the grain boundary and a complex oxynitride containing Al, N and rare earth metals present in the grain boundary. For these reasons, the rare earth oxide used in the preparation of the sintered body (A) reacts with AlN and $Al_2O_3$ present on the AlN particle surface in the sintering step and thereby remains in the grain boundary as the above complex oxide or the above complex oxynitride. In the step [1], when the sintered body (A) is heated, the complex oxide and the complex oxynitride in themselves are sublimated and also accelerate sublimation of AlN. The sublimated complex oxide and the sublimated complex oxynitride react with $N_2$ gas in a reducing atmosphere formed by the coexistence of the carbon generating source (namely are nitrogenated by reducing) and thereby they become AlN and are deposited on the substrate. To be sure, the sublimated AlN is also deposited on the substrate. By the deposition, the aluminum nitride single crystal forming polygonal columns is formed on the substrate. From the above mechanism, the aluminum nitride single crystal forming polygonal columns is formed by heating at a relatively low temperature in this manner.

In the step [1], the mechanism of using the mixture of the powdery AlN and the powdery rare earth oxide is considered as follows. At first, AlN, $Al_2O_3$ present on the AlN particle surface and the rare earth oxide are reacted to form the complex oxide containing Al and the rare earth metal and the complex oxynitride containing Al, N and the rare earth metal. Subsequently, in the same manner as the sintered body (A), the aluminum nitride single crystal forming polygonal columns is formed. From the above mechanism, the aluminum nitride single crystal forming polygonal columns is formed by heating at a relatively low temperature in this manner.

<Step [2]>

Next to the step [1], in the step [2], aluminum nitride of the aluminum nitride starting material (B) containing a content of the rare earth oxide of not more than 50 ppm is sublimated and thereby deposited on the surfaces of the polygonal columns of aluminum nitride single crystal so that the aluminum nitride single crystals are further grown to into the plate-shaped aluminum nitride single crystal.

More specifically, in the step [2], the sectional area of each polygonal column of the aluminum nitride single crystal is increased together with the deposition of the sublimated aluminum nitride and the single crystals are united each other to form one plate-shaped single crystal. The deposition is caused in the vertical direction simultaneously and thereby the thickness of the formed plate-shaped single crystal is also increased. As a result, the plate-shaped aluminum nitride single crystal, which has been grown by incorporating at least the upper parts of the aluminum nitride single crystal forming polygonal columns, can be prepared at a high growing rate (referred to FIG. 6).

According to the formation density of the aluminum nitride single crystal forming polygonal columns or the heights of the polygonal columns, sufficient aluminum nitride is not fed to the lower part of each single crystal and thereby occasionally the increase of the sectional area of the crystal is small and the single crystals are not united. In such a case, between the hexagonal single crystal substrate and the plate-shaped aluminum nitride single crystal, the part of the aluminum nitride single crystal forming polygonal columns remains. As described above, when there is apart that the plate-shaped aluminum nitride single crystal is not formed, the remained aluminum nitride single crystal forming polygonal columns can be cut, to remove the part in the later step.

The aluminum nitride starting material (B) used in the present invention has a content of the rare earth oxide of not more than 50 ppm, preferably not more than 40 ppm. The content is desirably not less than 0 ppm and not more than 50 ppm, preferably not less than 0 ppm and not more than 40 ppm. The description "the content of the rare earth oxide is not more than 50 ppm" indicates that the total amount of the rare earth oxides in 1 Kg of the aluminum nitride starting material (B) is limited to be not more than 50 mg.

Examples of the rare earth oxide may include $Y_2O_3$, $CeO_2$, $Ho_2O_3$, $Yb_2O_3$, $Gd_2O_3$, $Nd_2O_3$, $Sm_2O_3$ and $Dy_2O_3$.

When the content of the rare earth oxides contained in the aluminum nitride starting material (B) is limited in the above range, the plate-shaped aluminum nitride single crystal having high quality and a sufficient size can be grown. That is to say, the aluminum nitride sublimation gas generated by sublimation of aluminum nitride in the aluminum nitride starting material (A) efficiently forms the aluminum nitride single crystal forming polygonal columns in a proper formation density on the substrate by deposition, and then the aluminum nitride sublimation gas generated by sublimation of aluminum nitride in the aluminum nitride starting material (B) forms the plate-shaped aluminum nitride single crystal substrate by deposition on the aluminum nitride single crystal forming polygonal columns and three-dimensional growing efficiently.

The amount of the rare earth oxides can be determined by the ICP emission analysis method. Specifically, the amount of the rare earth metals is determined by fluorescent X-ray analysis and this amount is converted into the amount of the rare earth oxides.

The aluminum nitride starting material (B) used in the present invention is not particularly limited as long as it has a composition that the content of the rare earth oxides is limited in the above range, and it may be in a sintered state, powdery aluminum nitrogen state or its molded state. The sintered state is most preferred in the point of handling.

In the sintered body (hereinafter the sintered body sometimes refers to "sintered body (B)"), as described above, the amount of the rare earth oxides is not more than 50 ppm, preferably not more than 40 ppm (the amount of the rare earth oxides is over 0 ppm and not more than 50 ppm, preferably over 0 ppm and not more than 40 ppm, or 0 ppm (the rare earth oxide is not contained)). In the case of the starting material (B), the amount of the rare earth oxides is also determined by the ICP emission analysis method. Specifically, the amount of the rare earth metals contained in the starting material (B) is determined by the fluorescent X-ray analysis and this amount is converted into the amount of the rare earth oxides used in the preparation of the starting material (B).

The sintered body can be produced in the following manner.

The powdery aluminum nitride, which is a starting material, has a purity of not less than 97% by weight, preferably not less than 99% by weight. The powdery aluminum nitride having a high purity most preferably used in the present invention is controlled to have a concentration of metal impurities (concentration of metals other than Al) of not more than 50 ppm and an oxygen concentration of not more than 1% by weight, particularly not more than 0.8% by weight.

Prior to the sintering, the above powder is molded into a shape capable of preparing a desired component. The molding can be carried out by means of a known method. In order to form a molded article having high strength and enhance the yield thereof, the molding is preferably carried out using an organic binder.

For example, the powder is mixed with the organic binder and optionally a dispersant, a plasticizer, a solvent, etc, to prepare a slurry or paste for molding, and the slurry or paste for molding is molded into a molded article by a molding means such as extrusion molding method, injection molding method or casting molding method. Furthermore, it is possible to prepare granules from the slurry for molding and form a molded article by the compression molding method.

Examples of the organic binder may include a butylal resin such as polyvinyl butylal etc, and an acryl resin such as polymethacrylbutyl butyl, etc. The organic binder is used in an amount of usually 0.1 to 30 parts by weight, preferably 1 to 15 parts by weight based on 100 parts by weight of the powdery aluminum nitride.

Examples of the dispersant are glycerin compounds, and examples of the plasticizer are phthalic acid esters. Examples of the solvent are isopropyl alcohol and hydrocarbons.

Incidentally, the molding can be carried out by the compression molding method without using the organic binder. For example, the powdery aluminum nitride is preliminarily molded into a green article by a mono-axial forming device and the green article is molded at a pressure of 1 to 4 t/cm$^2$ by CIP (cold isotactic pressure) molding machine to prepare the molded article.

The molded article thus prepared in the above manner is de-waxed (de-bindered) and then sintered.

The de-waxing can be carried out by heating at any atmosphere of air, nitrogen or hydrogen. The de-waxing temperature, which varies depending on the kind of the organic binder, is usually from 300 to 900° C., preferably 300 to 700° C. When the molding is carried out without using the organic binder in the compression molding method, it is unnecessary to carryout the de-waxing step.

The sintering in the inert gas atmosphere is preferably carried out at a temperature of 1650 to 1950° C. for a period of 1 to 10 hr.

The sintered body (B) is prepared through the above sintering step.

In the step [2], a substrate 24 prepared by growing the aluminum nitride single crystal forming polygonal columns 22 (in the present specification, sometimes referred to the substrate 24 prepared in the step [1]) and the aluminum nitride starting material (B) are disposed in the crucible 12 (referred to FIG. 2). Specifically, after the step [1], the heating with the high frequency heating coil 20 is stopped and then the inside of the crucible 12 is cooled to normal temperature, to return the atmosphere of the furnace main body 10 to normal temperature. Thereafter, the aluminum nitride starting material (A) is replaced with the aluminum nitride starting material (B). Furthermore, the distance between the surface of the substrate 24 prepared in the step [1] (wherein the surface indicates the surface of the hexagonal inorganic single crystal substrate used in the step [1] not the tips of the polygonal pillar-shaped crystals) and the surface of the aluminum nitride starting material (B) is set to be usually 1 to 35 mm, preferably 30 to 35 mm. When the distance is nearer than the above range, the temperature of the substrate is higher than the desired temperature and the substrate is occasionally damaged. When the distance is farther than the above range, the single crystals are sometimes not grown. The optimum distance is preferably determined by carrying out an experiment previously because the optimum range of the distance varies depending on the size of the crucible and the like. Subsequently, the pressure of the furnace main body 10 is brought to 1 to 1000 kPa, preferably 90 to 1000 kPa. Specifically, exhaust is carried out from the gas exhaust vent 16 and simultaneously N$_2$ gas or Ar gas is introduced from the gas feed opening 18 so that the pressure at 25° C. becomes the above pressure. In this case, it is preferred to use the N$_2$ gas. Moreover, the N$_2$ gas or Ar gas has a purity of more preferably not less than 99.9999%.

After the furnace main body 10 becomes the above atmosphere, operating the high frequency heating coil 20 provided on the outside of the furnace main body 10, the crucible 12, namely, the aluminum nitride starting material (B) and the substrate 24 prepared in the step [1] are heated and thereby the temperature T$_3$ of the aluminum nitride starting material (B) is brought to 1900 to 2300° C. and also the temperature T$_4$ of the substrate 24 prepared in the step [1] is brought to 1800 to 2100° C. Moreover, the temperature T$_3$ is preferably 50 to 200° C. higher than the temperature T$_4$. In the above, the case that the heating is started after the crucible main body has been the above atmosphere is described. Moreover, the heating may be carried out previously or the heating and the atmosphere formation may be carried out simultaneously.

In order to become the temperatures T$_3$ and T$_4$ to the above ranges, two heaters which control systems are independent may be used. Specifically, in this case, the output for heating the aluminum nitride starting material (B) and the output for heating the substrate 24 prepared in the step [1] are respectively regulated to be the above temperatures.

Figure 3:
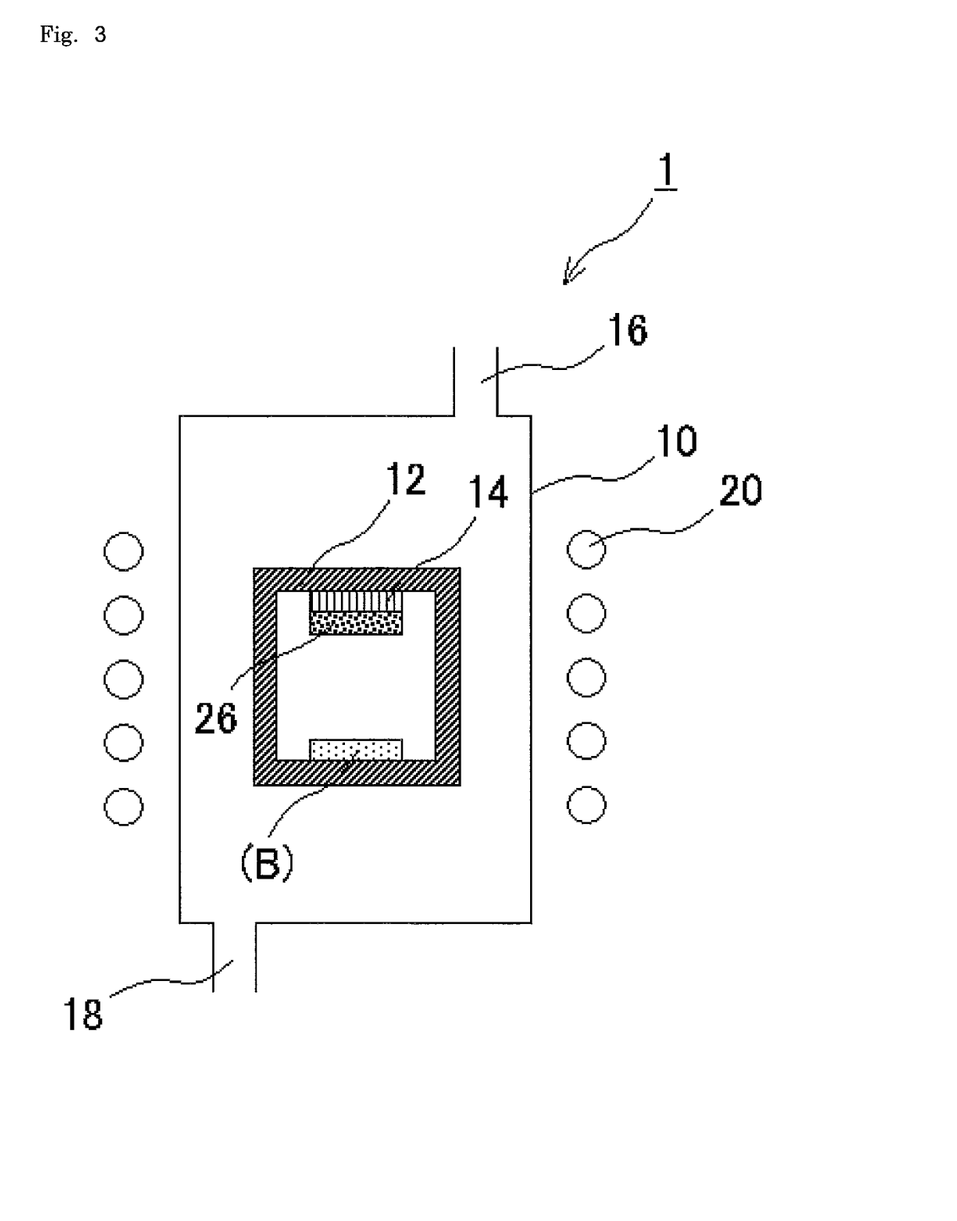
FIG. 3 is a view illustrating the present invention.

Through the above step, aluminum nitride of the aluminum nitride starting material (B) is sublimated and thereby further deposited on the single crystals formed on the substrate 24 prepared in the step [1] to grow a plate-shaped aluminum nitride single crystal 26 (referred to FIG. 3). In order to grow the plate-shaped aluminum nitride single crystal having a sufficient size and a sufficient thickness, it is preferred that the temperatures T$_3$ and T$_4$ reach the above ranges and thereafter they are usually maintained for 1 to 50 hr.

The crucible 12 consists of a vessel and a lid not shown in FIGS. 1 to 3. In the steps [1] and [2], the starting material [A] or [B] is put in the vessel and the substrate 14 or 24 is fitted to the lid. Since the vessel main body and the lid are not sealed, the atmosphere of the crucible 12 can be changed by exhausting or introducing the gas through the gas exhaust vent 18 or the gas feed opening 16.

In the steps [1] and [2], it is regarded that the temperature of the surface of the polygonal columnar-shaped or plate-shaped aluminum nitride single crystal is usually the same as the temperature of the substrate 14 or the substrate 24. However, when the thickness of the aluminum nitride single crystal becomes larger and the temperature of the surface of the aluminum nitride single crystal separates from the range of the temperature T$_2$ or T$_4$, the temperature of the surface of the aluminum nitride single crystal may be maintained in the range of $T_2$ or $T_4$ by changing the distance between the surface of the aluminum nitride single crystal and the surface of the starting material (A) or (B).

By the above method, the plate-shaped aluminum nitride single crystal having a thickness of about 0.05 to 10 mm can be prepared efficiently. Furthermore, the diameter of the plate-shaped aluminum nitride single crystal depends on the size of the substrate 14 or the device used. In the above method, the diameter is usually 10 to 50 mm, preferably 10 to 30 mm.

In the step [2], the above single crystal can be prepared at a high growing rate. Specifically, the production process including the two steps according to the present invention and a conventional production process are compared in the case of producing a plate-shaped single crystal having equivalent high quality. In the production process (step [2]) of the present invention, it is possible to attain the growing rate of not less than 300 μm/h, as compared with in a conventional production process such that the growing rate is 100 μm/h. In the present invention, the plate-shaped aluminum nitride single crystal can be prepared at a very high growing rate.

Moreover, the plate-shaped aluminum nitride single crystal thus prepared generally has a full width at half maximum of an X ray diffraction rocking curve in the (002) face of 100 to 200 arc sec.

As described in the step [1], the formation of the aluminum nitride single crystal can be confirmed by the X-ray diffraction measurement.

When the columnar-shaped AlN single crystals are grown previously and then on the surfaces thereof, AlN single crystals are grown to form a plate-shaped crystal as described above, this case has a merit such that the plate-shaped aluminum nitride single crystal which is free from threading dislocation or lattice distortion and has high quality can be prepared because mismatching with the primary crystal is low. Moreover, the size thereof can be made into φ50 mm.

Growing the aluminum nitride single crystal in the above conditions, the plate-shaped aluminum nitride single crystal having the above physical properties can be grown.

Moreover, in the present invention, as described above, the resulting plate-shaped aluminum nitride single crystal is prepared using the aluminum nitride starting material (B) after the step of growing the aluminum nitride single crystal forming polygonal columns using the aluminum nitride starting material (A). Therefore, it is possible to prepare the single crystal having high quality and a sufficient size.

The aluminum nitride single crystal forming polygonal columns according to the present invention can be suitably used as a filler for aluminum nitride substrates having high toughness. Furthermore, it can be suitably used as a starting material for aluminum nitride films having high orientation properties.

Moreover, the aluminum nitride single crystal forming polygonal columns according to the present invention is oriented, molded and sintered, and thereby the aluminum nitride substrate having high thermal conduction properties can be prepared.

In the hexagonal single crystal substrate on which the plate-shaped aluminum nitride single crystal prepared in the present invention is formed, when the aluminum nitride single crystal forming polygonal columns is present between the hexagonal single crystal substrate and the plate-shaped aluminum nitride single crystal, the polygonal columns of aluminum nitride single crystal is cut on a parallel with the hexagonal single crystal substrate to prepare a substrate having the same composition as that of the substrate prepared in the step [1] (the substrate prepared by growing the aluminum nitride single crystal forming polygonal columns). Accordingly, using this substrate, the step [2] can be directly carried out skipping the procedure of the step [1].

In the hexagonal single crystal substrate on which the plate-shaped aluminum nitride single crystal prepared in the present invention is formed, the plate-shaped aluminum nitride single crystal part may be cut on a parallel with the hexagonal single crystal substrate and submitted to mirror processing to prepare a substrate having a surface mirror processed. The substrate having a mirror-processed surface can be further used as a substrate for growing the plate-shaped single crystal.

The present invention is described in more detail with reference to the following examples below but the present invention should not be limited by these examples.

EXAMPLE

Evaluation Methods

1. Size of Single Crystal

The size of a single crystal was measured by taking a photograph of a polygonal columnar-shaped AlN single crystal from the upper side in a magnification of 50 to 1000 times using a scanning electron microscope (SEM).

2. Crystallinity Evaluation

The crystallinity was evaluated by a half width of a peak in each face direction using an X-ray diffraction apparatus.

3. Concentration of Rare Earth Oxides in Sintered Body (A) and Sintered Body (B)

The concentration of a rare earth oxide was analyzed by a fluorescent X-ray diffraction apparatus. The concentration of the rare earth metal was measured by the ICP emission analysis method and the amount of the rare earth oxide was determined. Specifically, a specimen was pulverized and then nitric acid and phosphoric acid were added and decomposed with heat to prepare a solution and ICP emission analysis of the solution was carried out using [ICPS-7510] manufactured by Shimadzu Corporation. The metal concentration was determined based on the calibration curve previously prepared. More specifically, the amount of the rare earth metal in the sintered body (A) was measured and then this amount was converted to the amount of the rare earth oxide used in the preparation of the sintered body (A). Concerning to the sintered body (B), the amount of the rare earth oxide was determined in the same manner.

4. Content of Metal Impurity in Columnar-shaped Crystal

The aluminum nitride single crystal forming columns was pulverized and thermally decomposed with addition of nitric acid and phosphorus acid to prepare a solution and the solution was submitted to ICP emission analysis using "ICPS-7510" manufactured by Shimadzu Corporation. The metal concentration was determined based on the calibration curve previously prepared.

5. Formation Density

The SEM photograph of a 1 mm square was taken, the occupied proportion of the AlN single crystal was determined from the area of the AlN single crystal forming polygonal columns formed (deposited area) per area unit, and the formation density was calculated.

[Preparation of Sintered Body (A)]

To 100 parts by weight of powdery aluminum nitride having an oxygen concentration of 0.8 wt % and a concentration of metal elements other than Al of 35 ppm, 5 parts by weight of yttrium oxide having a specific surface area of 12 m²/g was added and then an organic binder, a plasticizer and a lubricant were added and mixed to prepare granules. Thereafter, the granules were molded into a plate-shaped molded article by a mono-axial press molding method.

The resulting molded article was de-waxed in an air atmosphere at a holding temperature of 550° C. for a holding time of 4 hr. Next, the de-waxed article was sintered in a nitrogen atmosphere at a holding temperature of 1800° C. for a holding time of 5 hr.

From the above manner, the sintered body (A) having a diameter φ of 30 mm and a thickness of 5 mm was prepared. The sintered body (A) had a rare earth oxide concentration of 3.8% by mass.

[Preparation of Sintered Body (B)]

To powdery aluminum nitride having an oxygen concentration of 0.8 wt % and a concentration of metal elements other than Al of 50 ppm, an organic binder, a plasticizer and a lubricant were added and mixed to prepare granules. Thereafter, the granules were molded into a plate-shaped molded article by a mono-axial press molding method.

The resulting molded article was de-waxed in an air atmosphere at a holding temperature of 550° C. for a holding time of 4 hr. Next, the de-waxed article was sintered in a nitrogen atmosphere at a holding temperature of 1850° C. for a holding time of 8 hr.

From the above manner, the sintered body (B) having a diameter φ of 30 mm and a thickness of 5 mm was prepared. The sintered body (B) had a rare earth oxide concentration of 20 ppm.

Example 1

Step [1]

In the step [1], a furnace 1 as shown in FIG. 1 was used together with a sapphire substrate (diameter of 10 mm) and the sintered body (A). In the center of a furnace main body 10 of the furnace 1, a carbon crucible 12 was provided. At first, the sapphire substrate and the sintered body (A) were disposed in the crucible 12 in such a way that the distance between the surface of the sapphire substrate and the surface of the sintered body (A) was 30 mm. Next, the atmosphere of the furnace main body 10 was a nitrogen atmosphere at 100 kPa. Specifically, exhaust was carried out from a gas exhaust vent 16 and also nitrogen gas (purity of 99.9999%) was fed from a gas feed opening 18 so that the atmosphere became the above pressure.

After the furnace main body 10 became the above atmosphere, the crucible 12, namely, the sintered body (A) and the sapphire substrate were heated by operating a high frequency heating coil 20 provided on the outside of the furnace main body 10 and thereby the temperature $T_1$ of the sintered body (A) was brought to 2100° C. and also the temperature $T_2$ of the sapphire substrate was brought to 1950° C.

Through the above steps, aluminum nitride of the sintered body (A) was sublimated and deposited on the sapphire substrate to grow the aluminum nitride single crystal forming polygonal columns 22 (referred to FIG. 2). After the temperatures $T_1$ and $T_2$ reached the above temperature, the temperatures were maintained for 1 hr. Since the formation density became 70% in this time, the heating with the high frequency heating coil 20 was stopped.

A specimen of the AlN single crystal forming polygonal columns was prepared by peeling from the substrate with a tweezers and used for various analyses.

Step [2]

In the step [2], the substrate prepared in the step [1] and the sintered body (B) were disposed in the crucible 12 (referred to FIG. 2). Specifically, the heating in the step [1] by the high frequency heating coil 20 was stopped and then the inside of the crucible 12 was cooled to normal temperature and the atmosphere in the furnace main body 10 was returned to normal pressure. Thereafter, the sintered body (A) was changed to the sintered body (B). Furthermore, the distance between the surface of the substrate prepared in the step [1] and the surface of the sintered body (B) was determined to be 30 mm. Next, the atmosphere of the furnace main body 10 was brought to a nitrogen gas atmosphere at 100 kPa. Specifically, the above atmosphere was formed in the same manner as in the step [1].

After the furnace main body 10 became the above atmosphere, the crucible 12, namely, the sintered body (B) and the substrate prepared in the step [1] were heated by operating the high frequency heating coil 20 provided on the outside of the furnace main body 10, and thereby the temperature $T_3$ of the sintered body (B) was brought to 2100° C. and also the temperature $T_4$ of the substrate prepared in the step [1] was brought to 1950° C.

Through the above step, aluminum nitride of the sintered body (B) is sublimated and thereby further deposited on the substrate prepared in the step [1] to grow a plate-shaped aluminum nitride single crystal 26 (referred to FIG. 3). After the temperatures $T_3$ and $T_4$ reached the above ranges, and the temperatures are usually maintained for 2 hr. Thereafter, the heating with the high frequency heating coil 20 was stopped.

The substrate was cut with a diamond pen for evaluation.

<Results of Evaluation of Aluminum Nitride Single Crystal Forming Polygonal Columns Prepared in the Step [1]>

It is clear from the SEM photograph shown in FIG. 4-1 that the aluminum nitride single crystal forming polygonal columns was formed in the step [1].

Furthermore, the aluminum nitride single crystal forming polygonal columns had an average bottom area of $7.1 \times 10^4$ µm² and an average height of 300 µm.

The half width of the peak in the (002) face determined by X-ray diffraction was 250 arc sec. The amount of metal impurities was below the detection limit determined by the ICP emission analysis.

<Results of Evaluation of Plate-shaped Aluminum Nitride Single Crystal Prepared in the Step [2]>

Figure 6:
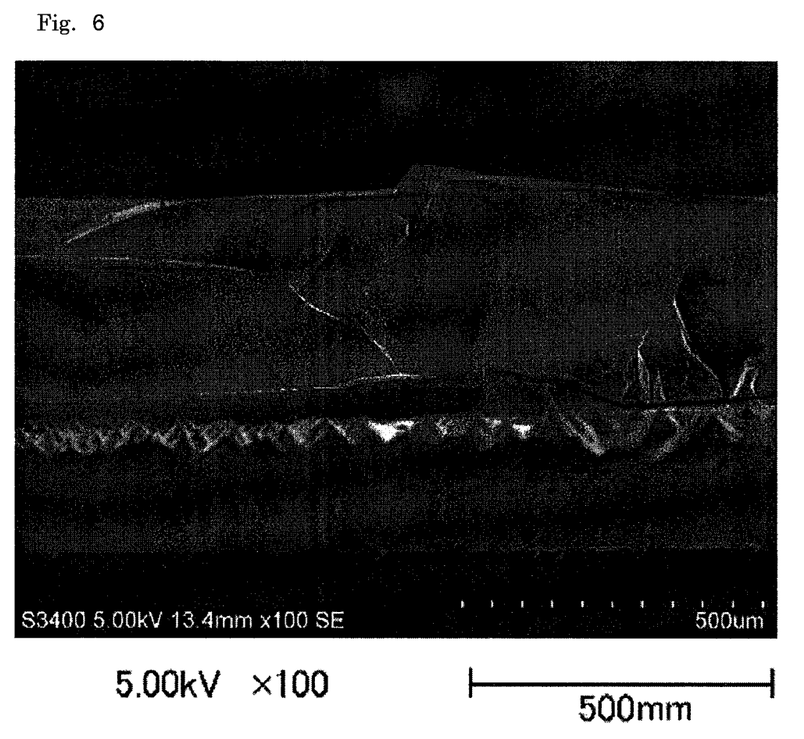
FIG. 6 is an SEM photograph taken in a sectional view of the plate-shaped aluminum nitride single crystal prepared in the step [2] in the example.

It is clear from the SEM photograph shown in FIG. 6 that the plate-shaped aluminum nitride single crystal was formed in the step [2].

The plate-shaped aluminum nitride single crystal had a bottom area of a diameter of 10 mm φ and a thickness of 360 µm.

The half width of the peak of the (002) face determined by the X-ray diffraction was 124 arc sec.

Example 2

The procedure of Example 1 was repeated except that the sapphire substrate (diameter: 10 mm) was changed to a SiC single crystal substrate (diameter: 10 mm).

<Results of Evaluation of Aluminum Nitride Single Crystal Forming Polygonal Columns Prepared in the Step [1]>

Average bottom area of the polygonal columnar-shaped AlN: $7.2 \times 10^{+4}$ µm²

Average height of the polygonal columnar-shaped AlN: 300 µm

Half width of the peak in the (002) face: 230 arc sec

Formation density of the polygonal columnar-shaped AlN: 70%

Amount of metal impurities: below the detection limit

<Results of Evaluation of Plate-shaped Aluminum Nitride Single Crystal Prepared in the Step [2]>
Thickness of the plate-shaped AlN single crystal: 360 μm
Half width in the (002) face: 110 arc sec Example 3

The procedure of Example 1 was repeated except that the sapphire substrate (diameter: 10 mm) was changed to an AlN single crystal (diameter: 10 mm).
<Results of Evaluation of Aluminum Nitride Single Crystal Forming Polygonal Columns Prepared in the Step [1]>
Average bottom area of the polygonal columnar-shaped AlN: $7.3 \times 10^{+4}$ μm$^2$
Average height of the polygonal columnar-shaped AlN: 300 μm
Formation density of the polygonal columnar-shaped AlN: 70%
Half width of the peak in the (002) face: 200 arc sec
Amount of metal impurities: below the detection limit
<Results of Evaluation of Plate-shaped Aluminum Nitride Single Crystal Prepared in the Step [2]>
Thickness of the plate-shaped AlN single crystal: 360
Half width in the (002) face: 100 arc sec Example 4

The procedure of Example 1 was repeated except that the sapphire substrate (diameter: 10 mm) was changed to an SiC single crystal substrate (diameter: 10 mm), and the temperature $T_1$ of the sintered body (A) was 2100° C. and the temperature $T_2$ of the SiC single crystal substrate was 1900° C. (temperature difference between the substrate and the starting material: 200° C.).
<Results of Evaluation of Aluminum Nitride Single Crystal Forming Polygonal Columns Prepared in the Step [1]>
Average bottom area of the polygonal columnar-shaped AlN: $1.0 \times 10^{+5}$ μm$^2$
Average height of the polygonal columnar-shaped AlN: 270 μm
Formation density of the polygonal columnar-shaped AlN: 72%
Half width of the peak in the (002) face: 250 arc sec
Amount of metal impurities: below the detection limit
<Results of Evaluation of Plate-shaped Aluminum Nitride Single Crystal Prepared in the Step [2]>
Thickness of the plate-shaped AlN single crystal: 310 μm
Half width in the (002) face: 130 arc sec Example 5

The procedure of Example 1 was repeated except that the sapphire substrate (diameter: 10 mm) was changed to an SiC single crystal substrate (diameter: 10 mm), and the temperature $T_1$ of the sintered body (A) was 2100° C. and the temperature $T_2$ of the SiC single crystal substrate was 1980° C. (temperature difference between the substrate and the starting material: 120° C.).
<Results of Evaluation of Aluminum Nitride Single Crystal Forming Polygonal Columns Prepared in the Step [1]>
Average bottom area of the polygonal columnar-shaped AlN: $6.5 \times 10^{+4}$ μm$^2$
Average height of the polygonal columnar-shaped AlN: 350 μm
Formation density of the polygonal columnar-shaped AlN: 68%
Half width of the peak in the (002) face: 250 arc sec
Amount of metal impurities: below the detection limit
<Results of Evaluation of Plate-shaped Aluminum Nitride Single Crystal Prepared in the Step [2]>
Thickness of the plate-shaped AlN single crystal: 410 μm
Half width in the (002) face: 125 arc sec Example 6

The procedure of Example 1 was repeated except that the sapphire substrate (diameter: 10 mm) was changed to an SiC single crystal substrate (diameter: 10 mm), and the temperature $T_1$ of the sintered body (A) was 2050° C. and the temperature $T_2$ of the SiC single crystal substrate was 1950° C. (temperature difference between the substrate and the starting material: 100° C.).
<Results of Evaluation of Aluminum Nitride Single Crystal Forming Polygonal Columns Prepared in the Step [1]>
Average bottom area of the polygonal columnar-shaped AlN: $7.0 \times 10^{+4}$ μm$^2$
Average height of the polygonal columnar-shaped AlN: 280 μm
Formation density of the polygonal columnar-shaped AlN: 73%
Half width of the peak in the (002) face: 250 arc sec
Amount of metal impurities: below the detection limit
<Results of Evaluation of Plate-shaped Aluminum Nitride Single Crystal Prepared in the Step [2]>
Thickness of the plate-shaped AlN single crystal: 340 μm
Half width in the (002) face: 125 arc sec Example 7

The procedure of Example 1 was repeated except that the sapphire substrate (diameter: 10 mm) was changed to an SiC single crystal substrate (diameter: 10 mm), and the temperature $T_1$ of the sintered body (A) was 2150'C and the temperature $T_2$ of the SiC single crystal substrate was 1950° C. (temperature difference between the substrate and the starting material: 200° C.).
<Results of Evaluation of Aluminum Nitride Single Crystal Forming Polygonal Columns Prepared in the Step [1]>
Average bottom area of the polygonal columnar-shaped AlN: $7.1 \times 10^{+4}$ μm$^2$
Average height of the polygonal columnar-shaped AlN: 350 μm
Formation density of the polygonal columnar-shaped AlN: 67%
Half width of the peak in the (002) face: 250 arc sec
Amount of metal impurities: below the detection limit
<Results of Evaluation of Plate-shaped Aluminum Nitride Single Crystal Prepared in the Step [2]>
Thickness of the plate-shaped AlN single crystal: 410 μm
Half width in the (002) face: 125 arc sec Example 8

The procedure of Example 2 was repeated except that the distance between the surface of the substrate 14 and the surface of the starting material (A) was brought to 10 mm in the step [1] and the distance between the surface of the substrate 24 and the surface of the starting material (B) was brought to 10 mm in the step [2].
<Results of Evaluation of Aluminum Nitride Single Crystal Forming Polygonal Columns Prepared in the Step [1]>
Average bottom area of the polygonal columnar-shaped AlN: $8.0 \times 10^{+4}$ μm$^2$ Average height of the polygonal columnar-shaped AlN: 330 µm
Formation density of the polygonal columnar-shaped AlN: 68%
Half width of the peak in the (002) face: 250 arc sec
Amount of metal impurities: below the detection limit
<Results of Evaluation of Plate-shaped Aluminum Nitride Single Crystal Prepared in the Step [2]>
Thickness of the plate-shaped AlN single crystal: 390 µm
Half width in the (002) face: 125 arc sec Example 9

The procedure of Example 2 was repeated except that the distance between the surface of the substrate 14 and the surface of the starting material (A) was 5 mm in the step [1] and the distance between the surface of the substrate 24 and the surface of the starting material (B) was 5 mm in the step [2].
<Results of Evaluation of Aluminum Nitride Single Crystal Forming Polygonal Columns Prepared in the Step [1]>
Average bottom area of the polygonal columnar-shaped AlN: $8.5 \times 10^{+4}$ µm$^2$
Average height of the polygonal columnar-shaped AlN: 350 µm
Formation density of the polygonal columnar-shaped AlN: 67%
Half width of the peak in the (002) face: 250 arc sec
Amount of metal impurities: below the detection limit
<Results of Evaluation of Plate-shaped Aluminum Nitride Single Crystal Prepared in the Step [2]>
Thickness of the plate-shaped AlN single crystal: 410 µm
Half width in the (002) face: 125 arc sec Example 10

The procedure of Example 2 was repeated except that the distance between the surface of the substrate 14 and the surface of the starting material (A) was 1 mm in the step [1] and the distance between the surface of the substrate 24 and the surface of the starting material (B) was 1 mm in the step [2].
<Results of Evaluation of Aluminum Nitride Single Crystal Forming Polygonal Columns Prepared in the Step [1]>
Average bottom area of the polygonal columnar-shaped AlN: $9.0 \times 10^{+4}$ µm$^2$
Average height of the polygonal columnar-shaped AlN: 370 µm
Formation density of the polygonal columnar-shaped AlN: 65%
Half width of the peak in the (002) face: 250 arc sec
Amount of metal impurities: below the detection limit
<Results of Evaluation of Plate-shaped Aluminum Nitride Single Crystal Prepared in the Step [2]>
Thickness of the plate-shaped AlN single crystal: 430 µm
Half width in the (002) face: 125 arc sec Example 11

The procedure of Example 1 was repeated except that the sapphire substrate (diameter: 10 mm) was changed to a SiC single crystal substrate (diameter: 10 mm), the treatment time in the step [1] was 6 hr and the treatment time in the step [2] was 6 hr.

<Results of Evaluation of Aluminum Nitride Single Crystal Forming Polygonal Columns Prepared in the Step [1]>
Average bottom area of the polygonal columnar-shaped AlN: $7.2 \times 10^{+4}$ µm$^2$
Average height of the polygonal columnar-shaped AlN: 2 mm
Formation density of the polygonal columnar-shaped AlN: 68%
Half width of the peak in the (002) face: 230 arc sec
Amount of metal impurities: below the detection limit
<Results of Evaluation of Plate-shaped Aluminum Nitride Single Crystal Prepared in the Step [2]>
Thickness of the plate-shaped AlN single crystal: 2.2 mm
Half width in the (002) face: 110 arc sec According to the present invention, aluminum nitride single crystals, which have low dislocation defect, low disorder of lattice arrangement and high quality, can be prepared. Therefore, the aluminum nitride single crystals can be used for semiconductor light-emitting devices such as ultraviolet ray light-emitting diode, etc., substrates for semiconductor elements desired to have high radiation properties, heat sinks and the like. As described above, the aluminum nitride single crystals can be used for electric and electronic parts, optical parts, parts of electrical machinery and apparatus, OA machinery parts and the like.

The invention claimed is:

1. A precursor for obtaining a plate-shaped aluminum nitride single crystal comprising a plurality of polygonal aluminum nitride columns on a hexagonal single crystal substrate on which the aluminum nitride single crystal is to be grown,
wherein the average bottom area of the columns is from $5 \times 10^3$ to $2 \times 10^5$ µm$^2$, and the average height of the columns is 50 µm to 5 mm, and
wherein the proportion (formation density) of the total of the bottom areas of the polygonal aluminum nitride columns to the surface area of the substrate on which the aluminum nitride single crystal to be grown is 40 to 85%.

2. The precursor for obtaining a plate-shaped aluminum nitride single crystal according to claim 1, which is obtainable by sublimating an aluminum nitride starting material (A) containing 0.1 to 30% by mass of a rare earth oxide by heating the starting material at a temperature of not lower than 2000° C., depositing aluminum nitride on a hexagonal single crystal substrate and thereby growing aluminum nitride single crystal in the shape of polygonal columns.

3. The precursor for obtaining a plate-shaped aluminum nitride single crystal according to claim 2, wherein the hexagonal single crystal substrate is an $\alpha$-Al$_2$O$_3$ single crystal substrate, a SiC single crystal substrate or an AlN single crystal substrate.

4. The precursor for obtaining a plate-shaped aluminum nitride single crystal according to claim 1, wherein metal impurities in the columns are below the ICP emission analysis detection limits when a sample of the columns are pulverized and heat decomposed in nitric acid and phosphoric acid to prepare a solution and the solution is analyzed by ICP emission analysis.

5. The precursor for obtaining a plate-shaped aluminum nitride single crystal according to claim 1, wherein the columns comprise Y of not more than 5 ppm, Ti of not more than 0.6 ppm, Ca, Fe, or Cr of not more than 1 ppm, Ni of not more than 2 ppm, Na of not more than 5 ppm, and Si of not more than 9 ppm.

6. The precursor for obtaining a plate-shaped aluminum nitride single crystal according to claim 1, which is cut to give aluminum nitride single crystal forming columns.

* * * * *

UNITED STATES PATENT AND TRADEMARK OFFICE
CERTIFICATE OF CORRECTION

| | | |
|---|---|---|
| PATENT NO. | : 8,921,980 B2 | Page 1 of 1 |
| APPLICATION NO. | : 12/743703 | |
| DATED | : December 30, 2014 | |
| INVENTOR(S) | : Hiroshi Amano et al. | |

It is certified that error appears in the above-identified patent and that said Letters Patent is hereby corrected as shown below:

On Title page 2, Column 2, item (56) OTHER PUBLICATIONS, Line 1, delete "AIN" and insert -- AlN --

Signed and Sealed this
Twenty-first Day of April, 2015

Michelle K. Lee
*Director of the United States Patent and Trademark Office*